(12) United States Patent
Sung et al.

(10) Patent No.: US 10,644,117 B2
(45) Date of Patent: May 5, 2020

(54) TECHNIQUES FOR CONTACT FORMATION IN SELF-ALIGNED REPLACEMENT GATE DEVICE

(71) Applicant: Varian Semiconductor Equipment Associates, Inc., Gloucester, MA (US)

(72) Inventors: Min Gyu Sung, Essex, MA (US); Wenhui Wang, Gloucester, MA (US); Jun Lee, Andover, MA (US); Sony Varghese, Manchester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/977,324

(22) Filed: May 11, 2018

(65) Prior Publication Data

US 2019/0348509 A1    Nov. 14, 2019

(51) Int. Cl.
*H01L 29/40* (2006.01)
*H01L 29/66* (2006.01)
*H01L 29/49* (2006.01)
*H01L 21/28* (2006.01)
*H01L 21/321* (2006.01)

(52) U.S. Cl.
CPC ...... *H01L 29/401* (2013.01); *H01L 21/28247* (2013.01); *H01L 21/32115* (2013.01); *H01L 29/495* (2013.01); *H01L 29/66545* (2013.01); *H01L 29/66795* (2013.01)

(58) Field of Classification Search
CPC .. H01L 21/28247; H01L 21/76853–21/76865; H01L 29/495; H01L 21/28079
See application file for complete search history.

(56) References Cited

U.S. PATENT DOCUMENTS

| 8,951,429 | B1 | 2/2015 | Liu et al. | |
|---|---|---|---|---|
| 2008/0157365 | A1* | 7/2008 | Ott | H01L 21/2807 257/750 |
| 2013/0320414 | A1* | 12/2013 | Fan | H01L 29/78 257/288 |
| 2016/0079243 | A1* | 3/2016 | Kim | H01L 21/76801 257/369 |

* cited by examiner

*Primary Examiner* — Thanh Y. Tran

(57) ABSTRACT

A method may include providing a device structure, where the device structure includes a semiconductor region, and a gate structure, disposed over the semiconductor region. The gate structure may further include a gate metal. The method may further include oxidizing an upper portion of the gate metal, wherein the upper portion forms an oxide cap, and wherein a lower portion of the gate metal remains metallic.

15 Claims, 5 Drawing Sheets

TECHNIQUES FOR CONTACT FORMATION IN SELF-ALIGNED REPLACEMENT GATE DEVICE

FIELD

The present embodiments relate to semiconductor device structures, and more particularly, to structures and processing for contacts in transistor devices.

BACKGROUND

As semiconductor devices scale to smaller dimensions, process complexity often increases to address device requirements. So-called replacement gate technology has been developed as an option for forming planar as well as fin type field effect transistors (finFET). The replacement gate approach forms a sacrificial gate using a sacrificial gate material, where the sacrificial gate is used to form device structures before being replaced by a final gate material. Known approaches using replacement gate process may also employ a self-aligned contact process, where the final gate metal is protected with an insulator cap during formation of contacts to the source/drain (S/D) region of the transistor.

A hallmark of the replacement gate process where the self-aligned contact process is also employed is the need to perform various polishing or planarization operations. A first planarization operation is used to polish and remove gate metal material from regions outside of the gate. A second planarization operation is used to polish and remove the insulator cap deposited on top of the gate metal, and used to electrically isolate the gate metal during S/D contact formation. These multiple planarization operations may be performed by chemical mechanical polishing (CMP), where a given CMP operation introduces gate height variation across different devices in a semiconductor chip, or across a semiconductor substrate (wafer). The combination of multiple CMP operations magnifies the gate height variation and accordingly reduces process margin in the self-aligned contact approach.

With respect to these and other considerations, the present disclosure is provided.

BRIEF SUMMARY

In one embodiment, a method is provided. The method may include providing a device structure, where the device structure includes a semiconductor region, and a gate structure, disposed over the semiconductor region. The gate structure may further include a gate metal. The method may further include oxidizing an upper portion of the gate metal, wherein the upper portion forms an oxide cap, and wherein a lower portion of the gate metal remains metallic.

In an additional embodiment, a method may include forming a device structure, where the device structure includes a semiconductor fin, and a gate structure, disposed over a first portion of the semiconductor fin. The gate structure may include a gate metal and a set of sidewall spacers. The device structure may further include a source/drain structure, disposed over a second portion of the semiconductor fin. The method may also include oxidizing an upper portion of the gate metal, wherein the upper portion forms an oxide cap, and wherein a lower portion of the gate metal remains metallic. The method may include selectively removing a top region of the oxide cap, wherein a bottom region of the oxide cap remains above the lower portion of the gate metal.

In an additional embodiment, a method may include providing a device structure, where the device structure includes a semiconductor fin, and a gate structure, disposed over the semiconductor fin. The gate structure may include a tungsten gate metal and a set of sidewall spacers. The method may also include oxidizing an upper portion of the tungsten gate metal, wherein the upper portion forms a tungsten oxide, and wherein a lower portion of the tungsten gate metal remains metallic. The method may further include selectively removing a top region of the tungsten oxide, wherein a bottom region of the tungsten oxide remains above the lower portion of the tungsten gate metal.

DETAILED DESCRIPTION

Figure 1A:
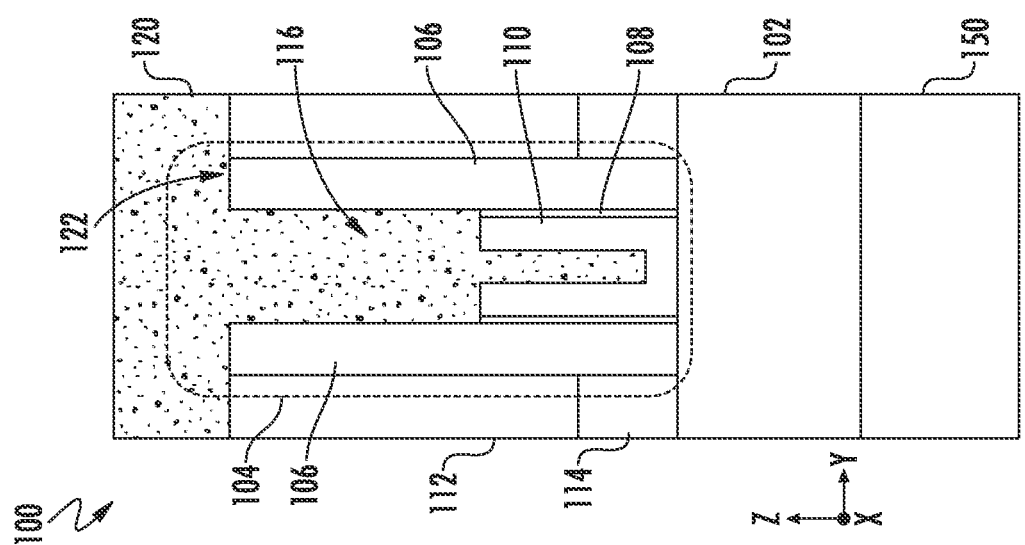
FIG. 1A to FIG. 1F show a device structure at various instances of fabrication, according to embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques to form transistor devices, including three dimensional transistors and planar transistors, formed in a semiconductor substrate, such as silicon, silicon:germanium, and so forth. As is known, planar and three-dimensional transistors, such as finFETs, may be arranged in circuitry to form various types of logic devices, as well as memory devices.

Figure 1B:
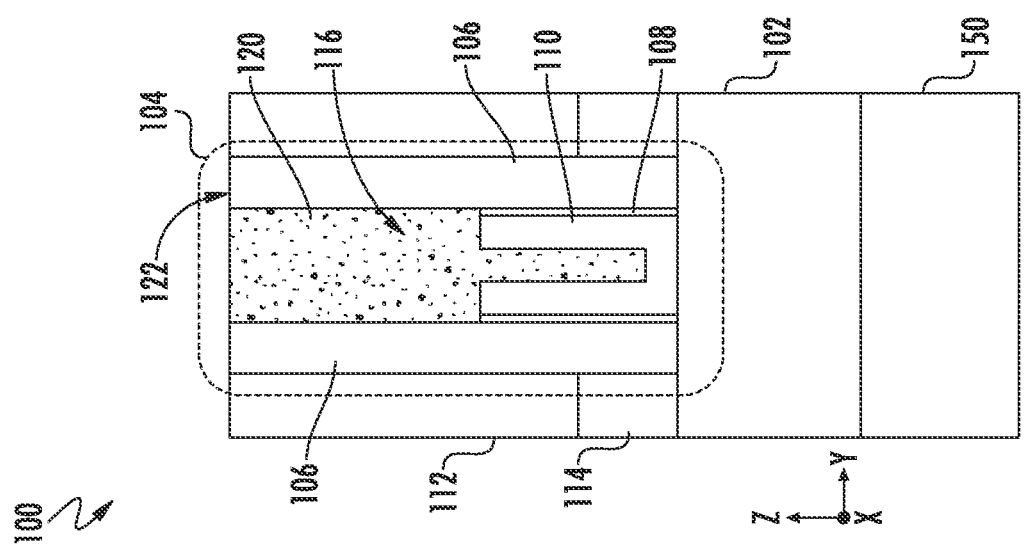
Figure 1C:
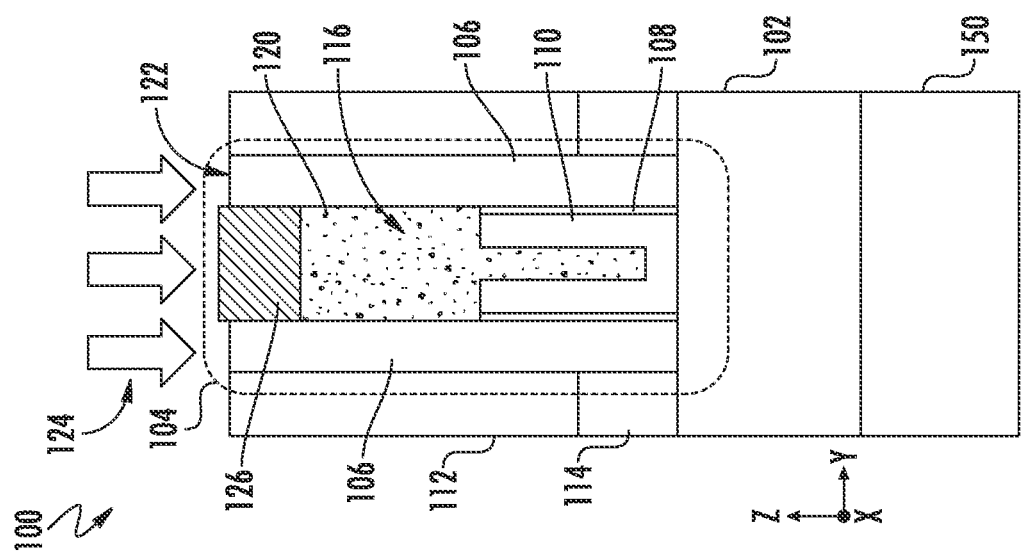
Figure 1D:
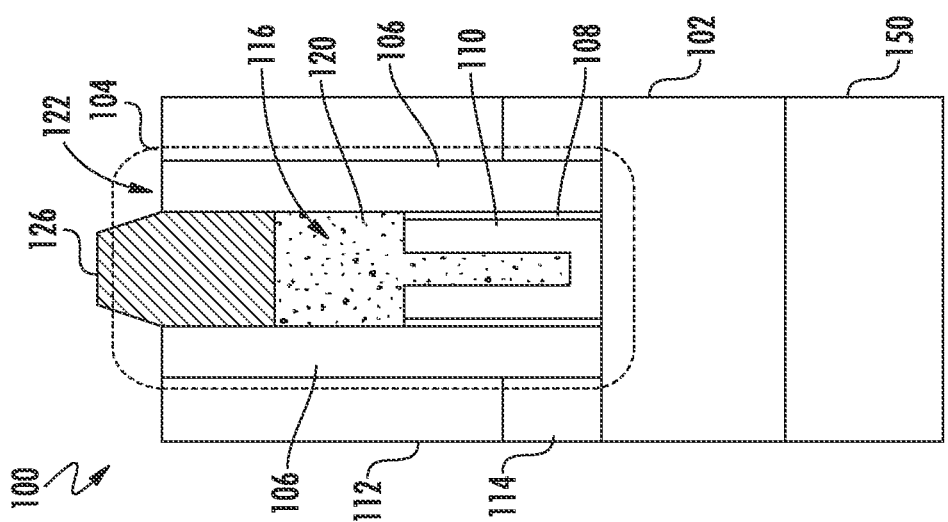
Figure 1E:
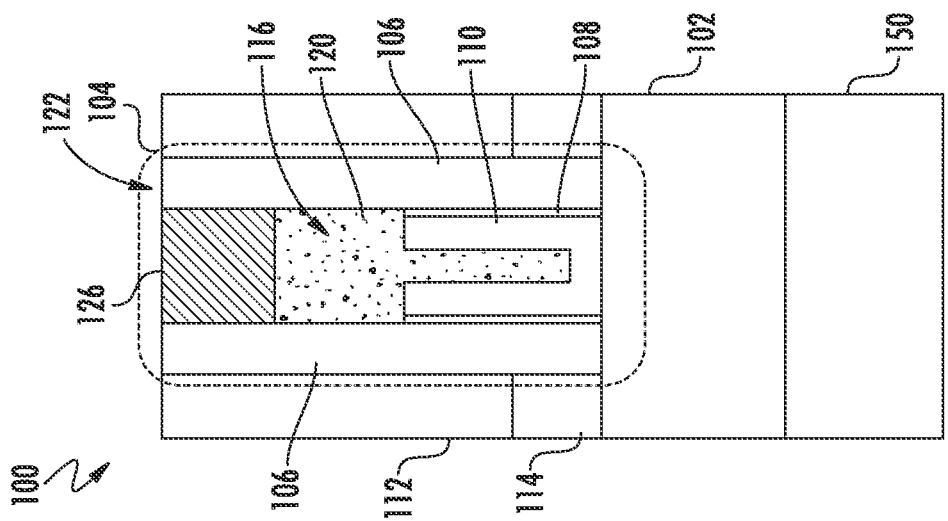
Figure 1F:
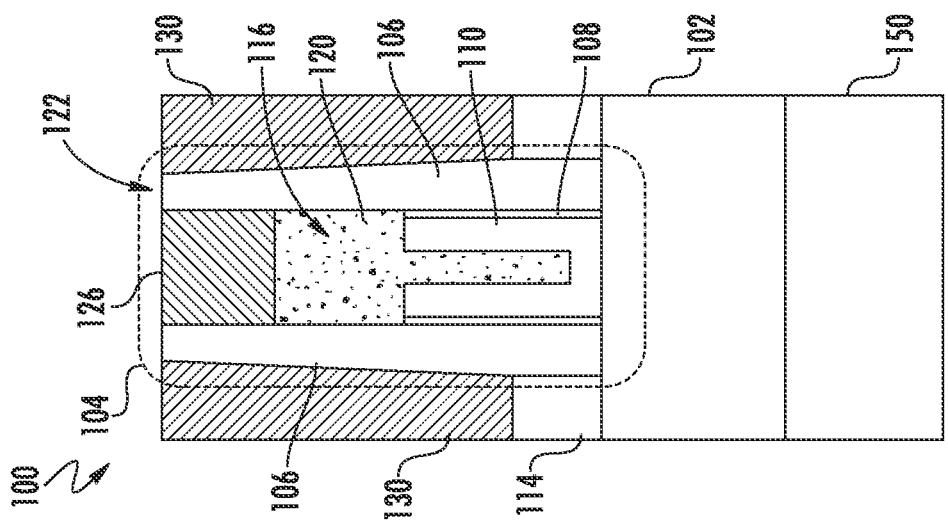

Turning now to FIG. 1A FIG. 1F there is shown a device structure 100, at various instances of fabrication, according to embodiments of the disclosure. The device structure 100 is shown in side cross-sectional view through the Y-Z plane of the Cartesian coordinate system shown. At FIG. 1A, the device structure 100 has been formed in a substrate 150. In various embodiments, the device structure 100 may be formed on a semiconductor region, such as a planar monocrystalline semiconductor region. In the particular illustration of FIG. 1A, the semiconductor region is represented by a semiconductor fin 102, where the semiconductor fin 102 may be formed integrally from a semiconductor base of the substrate as in known finFETs. The semiconductor fin 102 extends along the Y-axis, so the view of FIG. 1A illustrates the side of the semiconductor fin 102. In FIG. 1A, a gate structure 104 is disposed over the semiconductor fin 102. In other embodiments, the gate structure 104 may be disposed over a planar semiconductor, such as monocrystalline silicon. At the stage of processing shown in FIG. 1A, prior operations used to form the gate structure 104 may employ known replacement gate techniques where a replacement gate material is removed and substituted by a final gate material in a gate trench 116, formed between sidewall spacers. As such, the final gate material may be a gate metal, shown in FIG. 1A as the gate metal 120. In various non-limiting embodiments, the gate metal 120 may be a tungsten gate metal, wherein the tungsten is deposited by known techniques. As such, the gate metal 120 may be deposited in a blanket deposition operation, as suggested by FIG. 1A. The gate structure 104 may also include a gate insulator 108, such as a known high dielectric constant insulator material, as well as a work function metal 110, such as a known work function metal.

The gate structure 104 may further include a set of sidewall spacers, where a given sidewall spacer is denoted by sidewall spacer 106. In various embodiments the sidewall spacer 106 is a nitride sidewall spacer, such as silicon nitride. The device structure 100 further includes a dielectric, such as silicon oxide, disposed outside of the sidewall spacer 106, and is shown as dielectric 112 in FIG. 1A.

The device structure 100 further includes source/drain regions 114, formed in or on the semiconductor fin 102. In the embodiment of FIG. 1A, the source/drain regions 114 are raised source/drains, where formation may take place according to known techniques. As such, the source/drain regions 114 are covered by the dielectric 112. In order to form contacts to the source/drain regions 114, gate metal material above the dielectric 112, is removed, followed by removal of the dielectric 112, so as to expose the source/drain regions 114.

Turning now to FIG. 1B, there is shown a subsequent stage of processing after planarization of the gate metal 120, to remove gate metal 120 from the upper surface 122 of sidewall spacers 106, as well as from the surface of the dielectric 112. The planarization may be performed by known techniques, such as by CMP.

Turning now to FIG. 1C, there is shown a subsequent operation of oxidizing an upper portion of the gate metal 120, wherein the upper portion forms an oxide cap 126. Notably, a lower portion of the gate metal 120 remains metallic. FIG. 1D presents a view of device structure 100 after completion of the operation of FIG. 1C. In accordance with embodiments of the disclosure, the oxidizing may be accomplished by performing plasma oxidation. For example, oxygen ions may be directed to the device structure 100 by placing the substrate 150 in a plasma doping (PLAD) type apparatus, where the substrate 150 is suitable for oxidizing a portion of the gate metal 120. In some embodiments, the ion energy may range from 500 eV to 10 keV. The embodiments are not limited in this context. In FIG. 1C, the oxidation treatment is represented by oxidizing species 124, directed toward the gate metal 120. With suitable energy, oxygen ions may implant into the gate metal 120, causing oxidation of a portion of the gate metal, and forming the oxide cap 126, extending down into the original gate metal, as well as up from the top of the original gate metal. The oxidizing species 124 may be directed in a low temperature process where the substrate temperature advantageously remains below 500° C., and in some embodiments below 300° C., and in particular embodiments is approximately room temperature.

Advantageously, the present inventors have discovered where plasma oxidation may controllably oxidize a portion of a tungsten gate metal structure, to form a gate structure having tungsten metal disposed in a lower portion, and a tungsten oxide disposed on an upper portion of the gate metal structure, covering the tungsten metal. In various embodiments the thickness of the tungsten oxide, functioning as an oxide cap, is in the range of 10 nm to 20 nm. The low substrate temperature for plasma oxidation, where substrate temperature may range below 300 C and may be approximately room temperature, ensures thermal oxidation does not take place, where thermal oxidation of tungsten is known to create deleterious effects, such as nanorod formation.

Figure 2A:
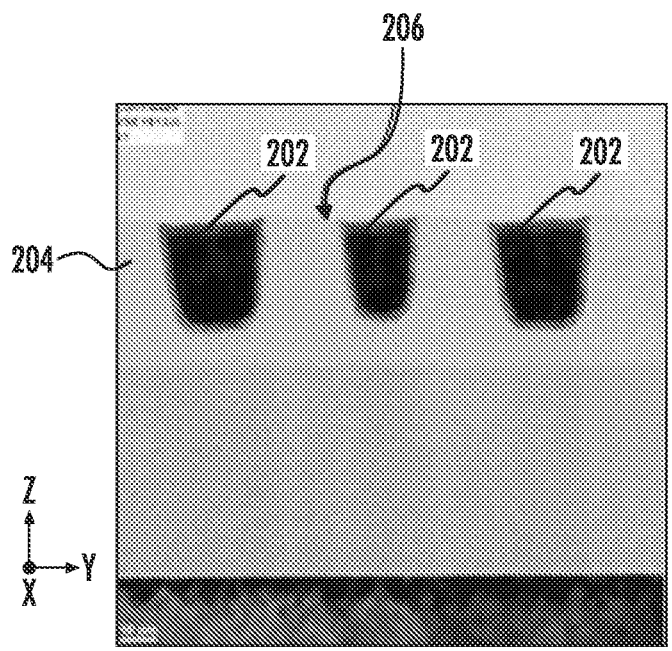
FIG. 2A and FIG. 2B show an exemplary gate metal structure before and after oxidation treatment in accordance with embodiments of the disclosure.
Figure 2B:
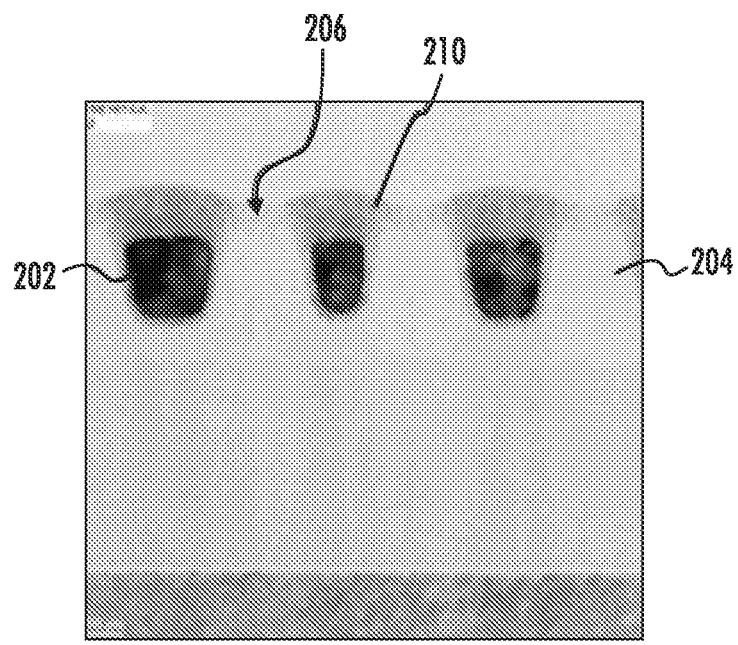

FIG. 2A and FIG. 2B show an exemplary gate metal structure before and after oxidation treatment in accordance with embodiments of the disclosure. In the example shown, a tungsten gate metal structure 202 is formed having a depth of approximately 40 nm in an insulator layer 204. The insulator layer 204 and tungsten gate metal structure 202 are planarized with one another wherein the tungsten gate metal structure 202 and the top surface 206 of the insulator layer 204 are co-planar. As such, the structure of FIG. 2A approximates the structure of FIG. 1B.

Turning to FIG. 2B, there is shown the resulting structure after the tungsten gate metal structure 202 is exposed to a plasma oxidation treatment. In this example, a dose of 1 E17/cm$^2$ O$_2$ ions has been directed to the tungsten gate metal structure 202 at an energy of 5 keV. As shown in FIG. 2B, the tungsten gate metal structure 202 has been oxidized to a depth of approximately 10 nm, consistent with the implant range of oxygen for the given energy. An oxide 210 is formed, extending above the top surface 206, where a total thickness of the oxide is approximately 20 nm. As such, the structure of FIG. 2B approximates the structure shown in FIG. 1D.

Turning to FIG. 1E, there is shown a subsequent instance after selectively removing a top region of the oxide cap 126, where a bottom region of the oxide cap 126 remains above the lower portion of the gate metal 120. As such, the oxide cap 126 may be planarized, wherein the oxide cap 126 no longer extends above the upper surface 122 of sidewall spacers 106, as well as from the surface of the dielectric 112. This configuration allows the dielectric 112 to be exposed for subsequent contact formation on source/drain regions 114. In order to form contacts on source/drain regions 114, the dielectric 112 is removed above the source/drain regions 114, and a conductor is deposited over the source/drain regions 114, as in known contact formation processes. This procedure leads to the structure of FIG. 1F, where source/drain contacts 130 are formed in contact with source/drain regions 114.

Notably, to properly preventing shorting between gate and source/drain regions 114, the gate metal 120 is to be protected during the contacting of source/drain regions 114. Advantageously, the oxide cap 126 may be an electric insulator and may act as an etch barrier, remaining in place during the formation of contacts to the source/drain regions 114, as shown in FIG. 1F. In particular embodiments where the oxide is tungsten oxide, such as WO$_3$, the WO$_3$ exhibits dielectric properties having a bandgap of 2.8 eV, suitable for use as an isolation layer and etch barrier during the contact formation process. Moreover, after the stage of processing shown in FIG. 1F, the oxide cap 126 may be selectively removed to allow formation of a gate contact to the gate metal 120.

Examples of suitable etchants for selectively etching tungsten oxide, either to partially remove the oxide cap 126 at the operation of FIG. 1E, or to fully remove the oxide cap 126 subsequently to source/drain contact formation, include combinations of ammonia and nitrogen trifluoride, as is known. The ammonia and nitrogen trifluoride may be provided in a remote plasma etching system, for example. Using this chemistry, the etch selectivity of tungsten oxide with respect to tungsten, silicon oxide, and silicon nitride may exceed 10/1 and by a suitable adjustment may exceed 100/1, as is known.

The procedures illustrated in FIGS. 1C-1E contrast with known approaches for replacement gate transistors, where, after the stage of FIG. 1B, the gate metal may be subject to a recess etch to remove a portion of gate metal. The recess etch in the known process flow is followed by filling of the recess by blanket deposition of an insulator, filling the recess above the gate metal, and covering other structures in blanket insulator, such as silicon nitride. To proceed to contacting of source/drain regions in the known process flow, characteristically, a CMP operation is performed for removing the blanket insulator. In the embodiment illustrated in FIGS. 1C-1E, such a CMP operation is avoided, since the insulator formed above the gate metal is formed from gate metal material, and thus does not entail formation of blanket insulator requiring subsequent CMP removal.

Figure 1G:
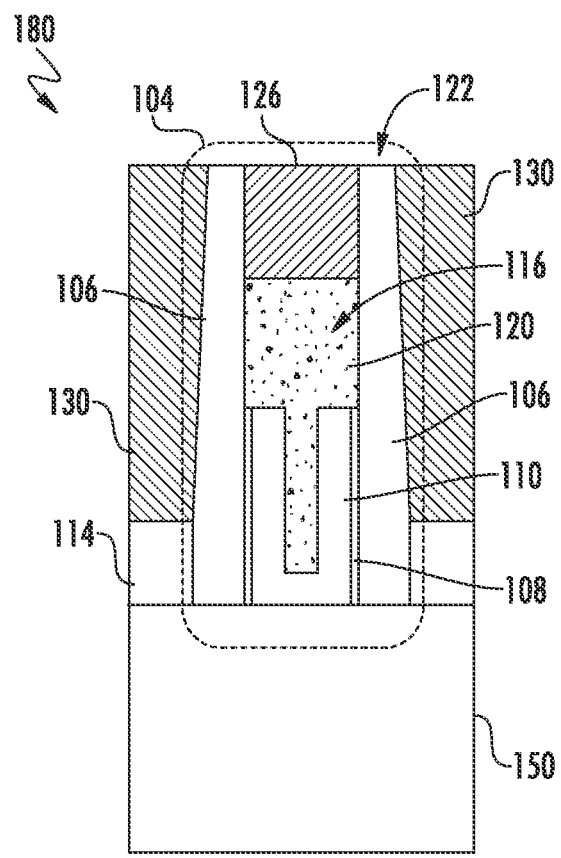
FIG. 1G shows another device structure, formed according to the operations of FIG. 1B to FIG. 1F, according to additional embodiments of the disclosure.

FIG. 1G shows another device structure, device structure 180, formed according to the operations of FIG. 1B to FIG. 1F, according to additional embodiments of the disclosure. In this example, the device structure 180 includes a monocrystalline planar substrate, shown as substrate 150, where the gate structure 104 is formed directly on the substrate 150, not on a semiconductor fin as in FIG. 1A. Notably, the device structure 180 exhibits other features in common with device structure 100, and is processed generally according to the operations discussed above with respect to FIGS. 1B-1E. Thus, the device structure 180 represents a planar transistor formed by a replacement gate/self-aligned contact process using the novel gate oxidation techniques discussed above.

Figure 3:
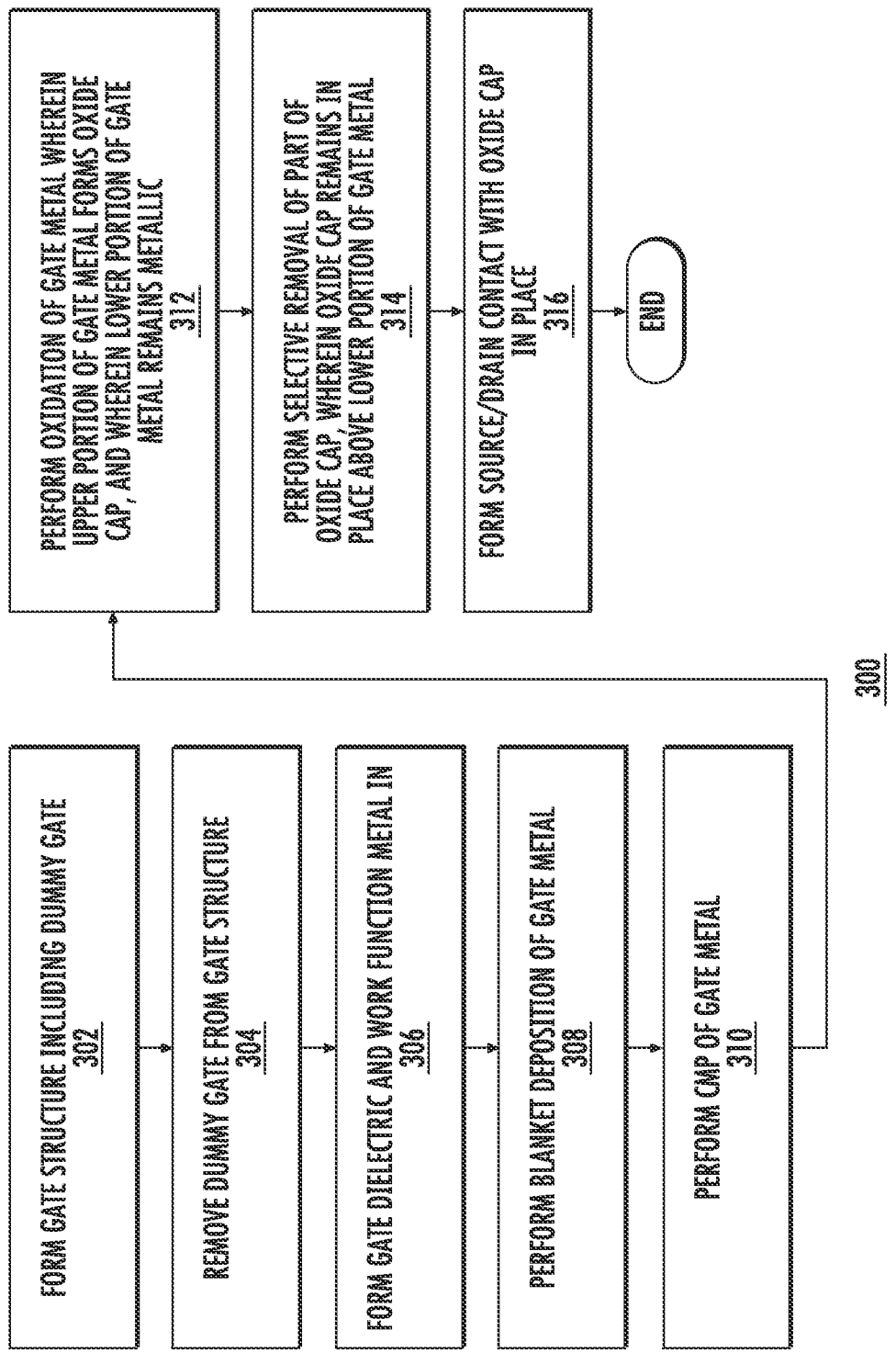
FIG. 3 shows an exemplary process flow, according to further embodiments of the disclosure.

Turning now to FIG. 3, there is shown a process flow 300, according to embodiments of the disclosure. In this embodiment, a replacement gate process may entail preliminary operations to define a gate structure. At block 302, a dummy gate structure is formed. The dummy gate structure may be formed over a substrate including monocrystalline semiconductor, such as over a semiconductor fin structure. In particular embodiments, a dummy gate such as polysilicon may be deposited and patterned to the desired dimension. Sidewall spacers such as nitride spacers may then be applied. In some examples, after patterning to form a dummy gate and sidewall spacers, a raised source/drain structure may be formed on the semiconductor fin, such as an epitaxially grown raised source/drain, as in known processes. An isolation oxide may then be formed over the raised source/drain structure.

At block 304, the dummy gate may be removed from the dummy gate structure, meaning the material formed between sidewall spacers of the dummy gate structure may be removed. In some examples, the dummy gate may be formed of polysilicon and an underlying oxide, which materials are selectively etched and removed in the presence of sidewall spacer spacers formed of silicon nitride.

At block 306, a gate dielectric, such a high dielectric constant material is deposited in the gate trench defined after removal of the dummy gate. A work function metal may also be deposited and patterned according to known processes to form a chamfer structure in the lower portion of the gate trench.

At block 308, a gate metal, such a tungsten, is deposited on the substrate, in a blanket deposition, where the gate metal may fill the gate trench, as well as covering the tops of sidewall spacers and dielectric.

At block 310, a CMP operation is performed, wherein the gate metal is removed in regions other than in the gate trench. As such, the gate structure may be planarized so the top of the gate metal in the gate trench is flush with the top of sidewall spacers and the top of the dielectric surrounding the gate structure, while no gate metal remains over the sidewall spacers and dielectric. As such, the resulting structure may represent a transistor structure with gate and source/drain regions in place, before formation of contacts to the gate and source/drain regions.

At block 312, the gate metal is oxidized. In various embodiments, a low temperature oxidation is performed, such as where the substrate is at room temperature, meaning unheated. Suitable apparatus for performing low temperature oxidation include a plasma doping (PLAD) type apparatus, where the substrate is immersed in a plasma chamber, a decoupled plasma oxidation (DPO) apparatus, or other plasma apparatus. Oxidation may also be performed using compact ion beam sources, where a ribbon ion beam is extracted from a plasma chamber and directed to a substrate in an adjacent chamber; beamline ion implanters; or other oxidation system. An advantage of using plasma based apparatus is the relatively high oxygen ion flus, where a dose of 1 E15/cm$^2$ to 1e17/cm$^2$ may be supplied to a substrate in a duration of 5 seconds to 600 seconds. As a result of the oxidation, an upper portion of the gate metal forms an oxide cap having a thickness of 10 nm to 30 nm. At the same time, a lower portion of the gate metal remains in place, for example, with a starting gate metal thickness of 40 nm, a gate metal thickness of 15 nm to 30 nm may remain in place. As such, the oxide cap may serve as a protection of the gate metal and an etch barrier for etch processes used to form subsequent contacts to source/drain regions of the transistor structure.

At block 314, in an optional operation, a part of the oxide cap is selectively removed. For example, in the operation of block 312, a portion of the oxide cap may extend above the top of sidewall spacers of the gate structure. In the example of tungsten gate metal, where the oxide cap forms a tungsten oxide, such as $WO_3$, the tungsten oxide may be selectively etched using a combination of ammonia and nitrogen trifluoride. In this manner, etching of other structures, such as nitride sidewalls, oxide dielectric, and tungsten gate metal, may be maintained below acceptable levels.

At block 316, source/drain contacts are formed in the transistor structure while the oxide cap remains in place. Removal of dielectric covering the source/drain regions may be performed to expose these regions for deposition of contact material, while at least a portion of the oxide cap remains in place, protecting the gate metal. As an example, with an initial thickness of tungsten oxide of 10 nm to 20 nm, after source/drain contact formation, some tungsten oxide still remains.

The present embodiments provide various advantages over known device structures and fabrication methods. For one advantage, because the process to form an insulator above the gate metal does not entail blanket deposition, a second CMP operation is avoided, reducing gate height variability. In an additional advantage, the number of operations may be reduced, since no recess etch is needed to provide space for insulator formation above the gate metal. For another advantage, the oxidation process to oxidize a gate metal may be readily integrated into a manufacturing flow, serving to reduce overall cost.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
   providing a device structure, the device structure comprising:
      a semiconductor region, and
      a gate structure, disposed over the semiconductor region, the gate structure comprising a gate metal; and
   oxidizing an upper portion of the gate metal, wherein the upper portion forms an oxide cap, and wherein a lower portion of the gate metal remains metallic,
   wherein the gate structure comprises a tungsten gate metal, a nitride sidewall spacer, disposed along the tungsten gate metal, and wherein the device structure further comprises a dielectric, disposed outside the nitride sidewall spacer, the method further comprising:
      selectively etching a top region of the oxide cap, wherein a bottom region of the oxide cap remains above the lower portion of the gate metal after the selectively etching.

2. The method of claim 1, the oxidizing comprising performing a plasma oxidation.

3. The method of claim 2, wherein the plasma oxidation comprises generating oxygen ions and directing the oxygen ions to the device structure at an ion energy of 500 eV to 10 keV.

4. The method of claim 1, further comprising forming a source/drain contact to the semiconductor region.

5. The method of claim 1, wherein the selectively etching the top region of the oxide cap comprises planarizing the upper portion.

6. A method, comprising:
   forming a device structure, the device structure comprising:
      a semiconductor fin;
      a gate structure, disposed over a first portion of the semiconductor fin, the gate structure comprising a gate metal and a set of sidewall spacers; and
      a source/drain structure, disposed over a second portion of the semiconductor fin;
   oxidizing an upper portion of the gate metal, wherein the upper portion forms an oxide cap, and wherein a lower portion of the gate metal remains metallic; and
   selectively removing a top region of the oxide cap, wherein a bottom region of the oxide cap remains above the lower portion of the gate metal.

7. The method of claim 6, the gate metal comprising tungsten.

8. The method of claim 6, the forming the device structure comprising:
   forming a dummy gate structure, the dummy gate structure comprising a sacrificial gate material and the set of sidewall spacers;
   selectively removing the sacrificial gate material; and
   replacing the sacrificial gate material with a gate metal, wherein the gate metal extends above the set of sidewall spacers; and
   polishing the gate metal to remove a portion of the gate metal extending above the set of sidewall spacers.

9. The method of claim 6, the oxidizing comprising performing a plasma oxidation.

10. The method of claim 9, wherein the plasma oxidation comprises generating oxygen ions and directing the oxygen ions to the device structure at an ion energy of 500 eV to 10000 eV.

11. The method of claim 6, wherein the oxide cap extends above the set of sidewall spacers after the oxidizing, and wherein the selectively removing the top region comprises planarizing the oxide cap with respect to the set of sidewall spacers.

12. The method of claim 6, wherein the gate structure comprises a tungsten gate metal, a nitride sidewall spacer, disposed along the tungsten gate metal, and wherein the device structure further comprises a dielectric, disposed outside the nitride sidewall spacer, wherein the oxide cap comprises a tungsten oxide, wherein the selectively removing the oxide comprises selectively etching the tungsten oxide with respect to the nitride sidewall spacer and the dielectric.

13. A method, comprising:
   providing a device structure, the device structure comprising:
      a semiconductor fin, and
      a gate structure, disposed over the semiconductor fin, the gate structure comprising a tungsten gate metal and a set of sidewall spacers;
   oxidizing an upper portion of the tungsten gate metal, wherein the upper portion forms a tungsten oxide, and wherein a lower portion of the tungsten gate metal remains metallic; and
   selectively removing a top region of the tungsten oxide, wherein a bottom region of the tungsten oxide remains above the lower portion of the tungsten gate metal.

14. The method of claim 13, wherein the tungsten oxide extends above the set of sidewall spacers after the oxidizing, and wherein the selectively removing the top region comprises planarizing the oxide with respect to the set of sidewall spacers.

15. The method of claim 13, wherein the gate structure comprises a nitride sidewall spacer, disposed along the tungsten gate metal, and wherein the device structure further comprises a dielectric, disposed outside the nitride sidewall spacer, wherein the selectively removing the top region of the tungsten oxide comprises selectively etching the tungsten oxide with respect to the nitride sidewall spacer and the dielectric.

* * * * *